US006749893B2

(12) United States Patent
Ouellet et al.

(10) Patent No.: US 6,749,893 B2
(45) Date of Patent: Jun. 15, 2004

(54) METHOD OF PREVENTING CRACKING IN OPTICAL QUALITY SILICA LAYERS

(75) Inventors: Luc Ouellet, Granby (CA); Jonathan Lachance, Granby (CA); Sylvie Archambault, Rock Forest (CA)

(73) Assignee: DALSA Semiconductor Inc., Waterloo (CA)

( * ) Notice: Subject to any disclaimer, the term of this patent is extended or adjusted under 35 U.S.C. 154(b) by 67 days.

(21) Appl. No.: 10/059,117

(22) Filed: Jan. 31, 2002

(65) Prior Publication Data

US 2003/0143334 A1 Jul. 31, 2003

(51) Int. Cl.$^7$ .............................. B05D 5/06; C23C 14/00
(52) U.S. Cl. ........................ 427/162; 427/571; 427/579; 427/255.27; 427/255.7; 427/376.2
(58) Field of Search ................................. 427/571, 579, 427/255.27, 255.7, 376.2, 162

(56) References Cited

U.S. PATENT DOCUMENTS

| 5,761,350 A | * | 6/1998 | Koh ............................. 385/14 |
| 5,857,048 A | * | 1/1999 | Feuer et al. ................... 385/88 |
| 5,979,188 A | | 11/1999 | Ojha |
| 6,028,977 A | * | 2/2000 | Newsome .................... 385/147 |
| 6,558,047 B1 | * | 5/2003 | Tran et al. ..................... 385/78 |

FOREIGN PATENT DOCUMENTS

| EP | 0 803 589 A1 | 10/1997 |
| EP | 1 302 792 A2 | 4/2003 |

OTHER PUBLICATIONS

D.K.W. Lam, "Low temperature plasma chemical vapor deposition of silicon oxynitride thinfilm waveguides", Applied Optics, vol. 23, No. 16, Aug. 15, 1984, pp. 27442746.

Franco Bruno et al., "Plasma–enchanced chemical vapor deposition of low–loss SiON optical waveguides at 1.5–$\mu$m wavelength", Applied Optics, vol. 30, No. 31, Nov. 1, 1991, pp. 4560–4564.

K. Imoto, et al., "High refractive index difference and low loss optical waveguide fabricated by low temperature processes", Electronics Letters, vol. 29, No. 12, Jun. 10, 1993, pp. 1123–1124.

Q. Lai et al., "Simple technologies for fabrication of low–loss silica waveguides", Electronics Letter, Mar. 31, 1992, no page numbers.

Yuan–Kuang Tu, et al., "Single–mode SiON/SiON$_2$/Si Optical Waveguides Prepared by Plasma–Enhanced Chemical Vapor Deposition", Fiber and Integrated Optics, vol. 14, pp. 133–139, 1995.

S. Yokoyama et al., "Optical waveguides on silicon chips", J. Vac. Sci. Technol. A13(3), May/Jun. 1995, pp. 629–635.

O.P. Agnihotri et al., "Silicon Oxynitrde Waveguides for Optoelectronic Integrated Circuits", Jpn. Appl., vol 36, Part 1, No. 11, Nov. 1997, pp. 6711–6713.

Daniel P. Poenar et al., "Optical properties of thin–film silicon–compatible materials", Applied Optics, vol36, No. 21, Jul. 20, 1997, pp. 5122–5128.

I. Pereyra et al., "High quality low temperature DPECVD silicon dioxide", Journal of Non–Crystalline Solids, 212, 1997, pp. 225–231.

(List continued on next page.)

Primary Examiner—Bret Chen
(74) Attorney, Agent, or Firm—Marks & Clerk

(57) ABSTRACT

A method for making an integrated photonic device involves depositing buffer, core and cladding layers on the front side of a wafer. A thick tensile stress layer is deposited on the back side of the wafer just prior to performing a high temperature thermal treatment above 600° C. on the cladding layer to prevent the cracking of the layers as a result of the thermal treatment.

24 Claims, 15 Drawing Sheets

| | Thickness on back | CLAD thermal treatment | |
|---|---|---|---|
| | | 600°C | 700°C |
| Extra BUFFER on back | 15µm | CRACKS | CRACKS |
| | 10µm | No Cracks | CRACKS |
| | 5µm | No Cracks | CRACKS |
| | 0µm (Std process) | No Cracks | CRACKS |
| Extra CORE on back | 0µm (Std process) | No Cracks | CRACKS |
| | 5µm | No Cracks | No Cracks |
| | 10µm | No Cracks | No Cracks |
| | 15µm | No Cracks | No Cracks |

OTHER PUBLICATIONS

M.I. Alayo, et al., "Thick $SiO_xN_y$ and $SiO_2$ films obtained by PECVD techniques at low temprature", Thin Film Solids, 332, 1998, pp. 40–45.

R. German et al., "Silicon–Oxynitride Layer for Optical Waveguide Applications", The Electronic Society Inc., vol. 99–1, May 199, Abstract No. 137, no page numbers.

K. Worhoff et al., "Plasma enhanced chemical vapor deposition silicon oxynitride optimized for application in integrated optics", Sensor and Actuators, 74, 1999, pp. 9–12.

A.J. Kenyon et al., "A luminescence study of silicon–rich silica and rare–eart doped silicon–rich silica", Electrochemical Society Proceedings vol. 91–11, pp. 304–318.

M. Hoffmann et al., "Low temperature, nitrogen doped waveguides on silicon with small core dimensions fabricated by PECVD/RIE", Waveguide Technology, WeC2, pp. 299–301.

M. Hoffmann et al., Low–Loss Fiber–Matched Low–Temperature PECVD Waveguides with Small–Core Dimensions for Optical Communications Systems, IEEE Photonics Technology Letters, vol. 9, No. 9, Sep. 1997, pp. 1238–1240.

K. Kasper et al., Rapid Deposition of High–Quality Silicon–Oxynitride Waveguides, IEEE Transactions Photonics Technology Letters, vol. 3, No. 12, Dec. 1991, pp. 1096–1098.

D.A.P. Bulla et al., "Deposition of thick TEOS PECVD silicon oxide layers for integrated optical waveguide applications", Thin Solid Films, 334, 1998, pp. 60–64.

E.S. Bulat et al., "Fabrication of waveguides using low–temperature plasma processing techniques", J. Vac. Sci. Technol. A 11(4) Jul./Aug. 1993, pp. 1268–1274.

M.V> Bazylenko et al. Fabrication of Low–Temperature PECVD Channel Waveguides with Significantly Improved Loss in the 1.50–1.55–$\mu m$ Wavelength Range, IEE Photonics Technology Letters, vol. 7, No. 7. Jul. 1995, pp. 774–776.

M.V. Bazylenko et al., "Pure and fluorine–doped silica films deposited in a hollow cathode reactor for integrated optic applications", J. Vac. Sci. Technol. A 14(2). Mar./Apr. 1996, pp. 336–345.

A. Durandet et al., "Silica buried channel waveguides fabricated at low temperature using PECVD", Electronics Letters, vol. 32, No. 4, Feb. 15, 1996, pp. 326–327.

R.W. Boswell et al., "Deposition of silicon dioxide films using the helicon diffusion reactor for integrated optics applications", Plasma Processing of Semiconductors, 1997, pp. 433–475.

S. Valette et al., New Integrated Optical Multiplexer–Demultiplexer Realized on Silicon Substrate, ECIO87, May 1987, pp. 145–147.

S. Valette, "State of the art of integrated optics technology at LETI for achieving passive optical components", Journal of Modern Optics, vol. 35, No. 6, 1998, pp. 993–1005.

G. Grand et al., "Low–Loss PECVD Silica Channel Waveguides for Optical Communications", Electronic Letters, vol. 26, No. 25, Dec. 6, 1990, pp. 2135–21–37.

S.M. Ojha et al., "Simple method of fabricating polarisation–insensitive and very low corsstalk AWG grating devices", Electronic Letters, vol. 34, No. 1, Jan. 8, 1998, pp. 78–79.

C.M. Johnson et al., "Thermal annealing of waveguides formed by ion implantation of silica–on–Si", Nuclear INstruments and Methods in Physics Research B 141, 1998, pp. 670–674.

Karen Liu et al., "Hybrid optoelectronic digitally tunable receiver", SPIE, vol. 2402, pp. 104–114.

Rene M. de Ridder et al., "Silicon Oxynitride Planar Waveguiding Structure for Application in Optical Communication", IEEE Journal of Selected Topics in Quantum Electronics, vol. 4, No. 6, Nov./Dec. 1998, pp. 930–936.

B. J. Offrein, "Wavelength Tunable Optical Add–After––Drop Filter with Flat Passband for WDM Networks", IEEE Photonics Technology Letters, vol. 11, No. 2, Feb. 1999, pp. 239–241.

* cited by examiner

Optical micrographs showing crack formation after CLAD deposition and thermal treatment at more then 600°c

| | Thickness on back | CLAD thermal treatment | |
|---|---|---|---|
| | | 600°C | 700°C |
| Extra BUFFER on back | 15μm | CRACKS | CRACKS |
| | 10μm | No Cracks | CRACKS |
| | 5μm | No Cracks | CRACKS |
| | 0μm (Std process) | No Cracks | CRACKS |
| Extra CORE on back | 0μm (Std process) | No Cracks | CRACKS |
| | 5μm | No Cracks | No Cracks |
| | 10μm | No Cracks | No Cracks |
| | 15μm | No Cracks | No Cracks |

FIG. 13

METHOD OF PREVENTING CRACKING IN OPTICAL QUALITY SILICA LAYERS

BACKGROUND OF THE INVENTION

1. Field of the Invention

This invention relates to the manufacture of integrated optical devices, such as optical multiplexers (Mux) and demultiplexers (Dmux), and in particular to a method of preventing cracking in optical quality silica layers.

2. Description of Related Art

The manufacture of integrated optical devices requires the fabrication of silica waveguides from low refractive index buffer and cladding silica layers and from a high refractive index core silica layer over a silicon wafer. These buffer, core and cladding silica layers must have excellent optical transparency in the 1.31 μm S-band, in the 1.55 μm C-band and in the 1.63 L-band.

FIG. 1 and FIG. 2 demonstrate that a novel PECVD technique described in our co-pending U.S. patent application Ser. No. 09/833,711 results in low refractive index buffer and cladding silica layers free from the undesirable residual SiN—H and Si:N—H oscillators (observed as a FTIR peak centered at 3380 cm-1 and which second vibration harmonics causes optical absorption in the 1.55 μm C-band) since eliminated after a low temperature thermal treatment of only 800° C.

FIG. 3 demonstrates that another novel PECVD technique described in our co-pending U.S. patent application Ser. No. 09/867,662 results in a high refractive index core silica layer free from the undesirable residual SiN—H and Si:N—H oscillators that are eliminated after a low temperature thermal treatment of only 800° C.

FIG. 4 demonstrates that a high refractive index core silica layer free from the undesirable residual SiN—H and Si:N—H oscillators can be achieved after a thermal treatment of only 600° C. as described in our co-pending U.S. patent application Ser. No. 09/956,916.

Figure 1:
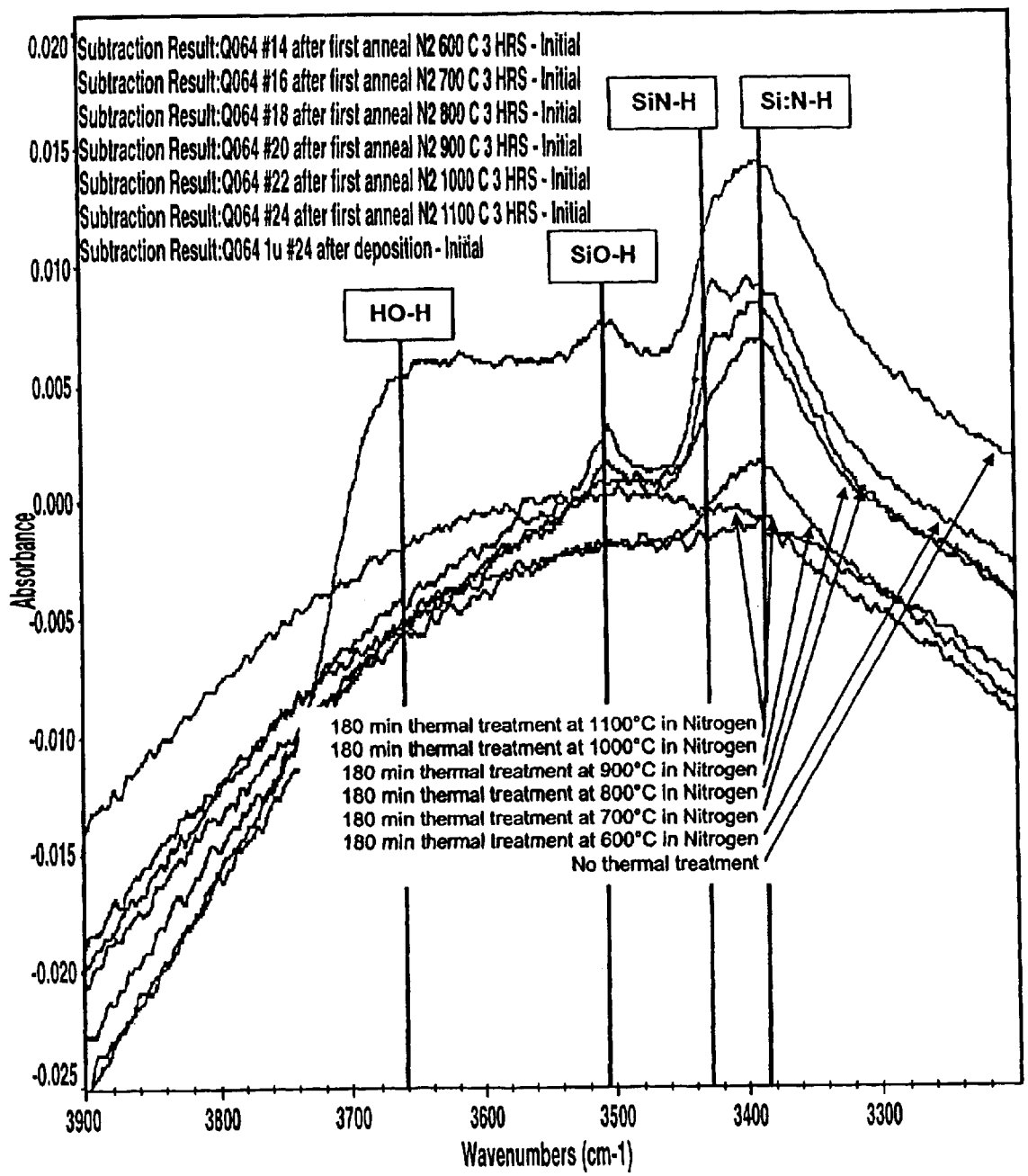

The following published literature describes the need for a high temperature heat treatment as to eliminate the residual SiN—H and Si:N—H oscillators and achieve high performance optical quality PECVD silica layers: Valette S., New integrated optical multiplexer-demultiplexer realized on silicon substrate, ECIO '87, 145, 1987; Henry C., Glass waveguides on silicon for hybrid optical packaging, J. Lightwave tech., 7 (10), 1350, 1989; Grand G., Low-loss PECVD silica channel waveguides for optical communications, Electron. Lett., 26 (25), 2135, 1990; Bruno F., Plasma-enhanced chemical vapor deposition of low-loss SiON optical waveguides at 1.5-μm wavelength, Applied Optics, 30 (31), 4560, 1991; Lai Q., Simple technologies for fabrication of low-loss silica waveguides, Elec. Lett., 28 (11), 1000, 1992; Lai Q., Formation of optical slab waveguides using thermal oxidation of SiOx, Elec. Lett., 29 (8), 714, 1993; Liu K., Hybrid optoelectronic digitally tunable receiver, SPIE, Vol 2402, 104, 1995; Tu Y., Single-mode SiON/SiO2/Si optical waveguides prepared by plasma-enhanced Chemical vapor deposition, Fiber and integrated optics, 14, 133, 1995; Hoffmann M., Low temperature, nitrogen doped waveguides on silicon with small core dimensions fabricated by PECVD/RIE, ECIO'95, 299, 1995; Poenar D., Optical properties of thin film silicon-compatible materials, Appl. Opt. 36 (21), 5112, 1997; Hoffmann M., Low-loss fiber-matched low-temperature PECVD waveguides with small-core dimensions for optical communication systems, IEEE Photonics Tech. Lett., 9 (9), 1238, 1997; Pereyra I., High quality low temperature DPECVD silicon dioxide, J. Non-Crystalline Solids, 212, 225, 1997; Kenyon T., A luminescence study of silicon-rich silica and rare-earth doped silicon-rich silica, Fourth Int. Symp. Quantum Confinement Electrochemical Society, 97-11, 304, 1997; Alayo M., Thick SiOxNy and SiO2 films obtained by PECVD technique at low temperatures, Thin Solid Films, 332, 40, 1998; Bulla D., Deposition of thick TEOS PECVD silicon oxide layers for integrated optical waveguide applications, Thin Solid Films, 334, 60, 1998; Valette S., State of the art of integrated optics technology at LETI for achieving passive optical components, J. of Modern Optics, 35 (6), 993, 1988; Ojha S., Simple method of fabricating polarization-insensitive and very low crosstalk AWG grating devices, Electron. Lett., 34 (1), 78, 1998; Johnson C., Thermal annealing of waveguides formed by ion implantation of silica-on-Si, Nuclear Instruments and Methods in Physics Research, B141, 670, 1998; Ridder R., Silicon oxynitride planar waveguiding structures for application in optical communication, IEEE J. of Sel. Top. In Quantum Electron., 4 (6), 930, 1998; Germann R., Silicon-oxynitride layers for optical waveguide applications, 195th meeting of the Electrochemical Society, 99-1, May 1999, Abstract 137, 1999; Worhoff K., Plasma enhanced chemical vapor deposition silicon oxynitride optimized for application in integrated optics, Sensors and Actuators, 74, 9, 1999; Offrein B., Wavelength tunable optical add-after-drop filter with flat passband for WDM networks, IEEE Photonics Tech. Lett., 11 (2), 239, 1999.

None of these cited references, however, address the crack issue of the various silica layers joining deep etched structures in the optical device stressed by the final thermal treatment ranging from 600 to 1200° C. in these cited references.

SUMMARY OF THE INVENTION

The present invention involves the use of a special technique wherein a thick PECVD silica layer is deposited on the back face of the silicon wafer just prior to a high temperature thermal treatment beyond 600° C. of the cladding silica layer of integrated optical devices made of thick buffer, core and cladding silica layers so as to prevent the cracking of these thick silica layers. This results in lower optical loss devices in the 1.31 μm S-band, in the 1.55 μm C-band and in the 1.63 L-band.

The use of an extra film deposited on the back of the wafer reduces tensile stress and, in fact, as to impose a compressive mechanical stress in cladding and prevent cladding cracking from occurring following a temperature treatment of the cladding at a temperature of more then 600° C.

Accordingly therefore the present invention provides a method a method of making an integrated photonic device having buffer, core and cladding layers deposited on a front side of a wafer having said front side and a back side. A thick tensile stress layer is deposited on the back side of the wafer just prior to performing a high temperature thermal treatment above about 600° C. on the cladding layer to prevent the cracking of said layers as a result of said thermal treatment. The extra layer preferably has a thickness between 5 to 15 μm and a tensile mechanical stress ranging from 10 to 2000 MPa.

The extra layer forms a core layer which is normally deposited after deposition of the cladding layer. The buffer, core and cladding layers are normally silica.

The invention also provides a method of making a photonic device, comprising providing a wafer having a front side and a back side; depositing a buffer layer on the front side of said wafer; subjecting the wafer to a first thermal treatment between 500 and 1200° C.; depositing a core layer over said buffer layer; subjecting the wafer to a second thermal treatment between 500 and 1200° C.; depositing a cladding layer; depositing an extra layer on the back side of the wafer; and performing a high temperature thermal treatment above about 600° C. on the cladding layer to prevent the cracking of the deposited layers.

DETAILED DESCRIPTION OF THE DRAWINGS

Figure 2:
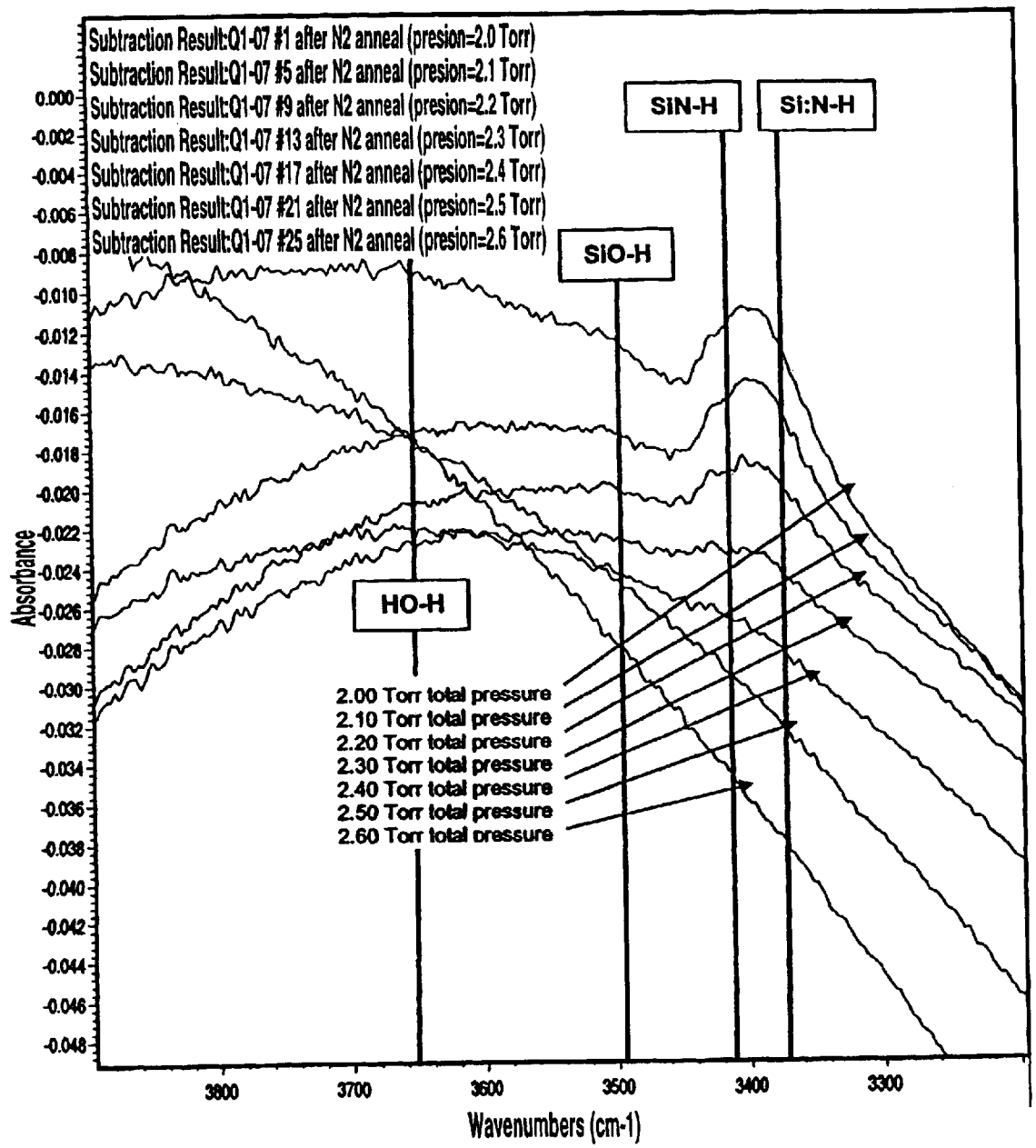
Figure 3:
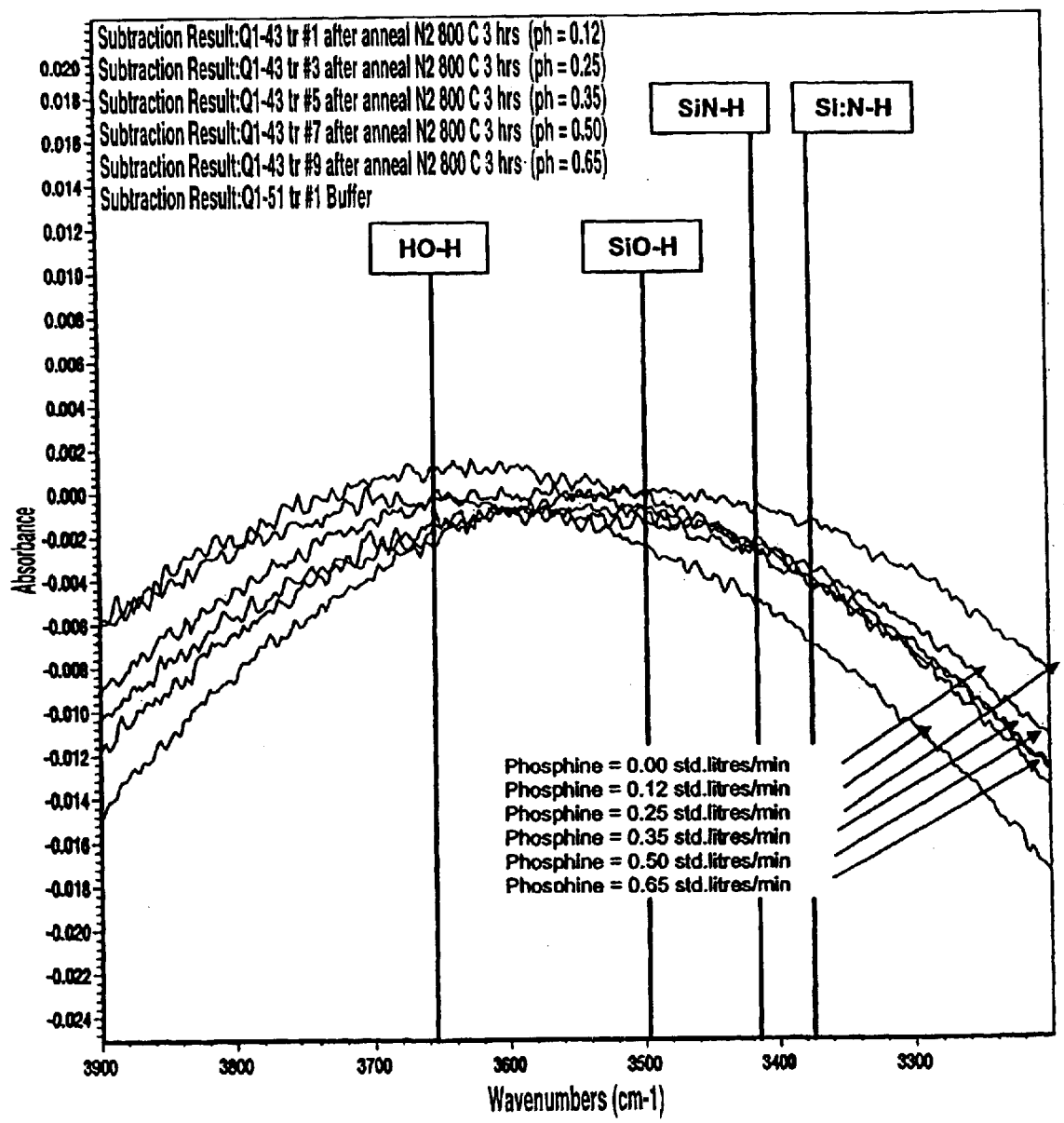
Figure 4:
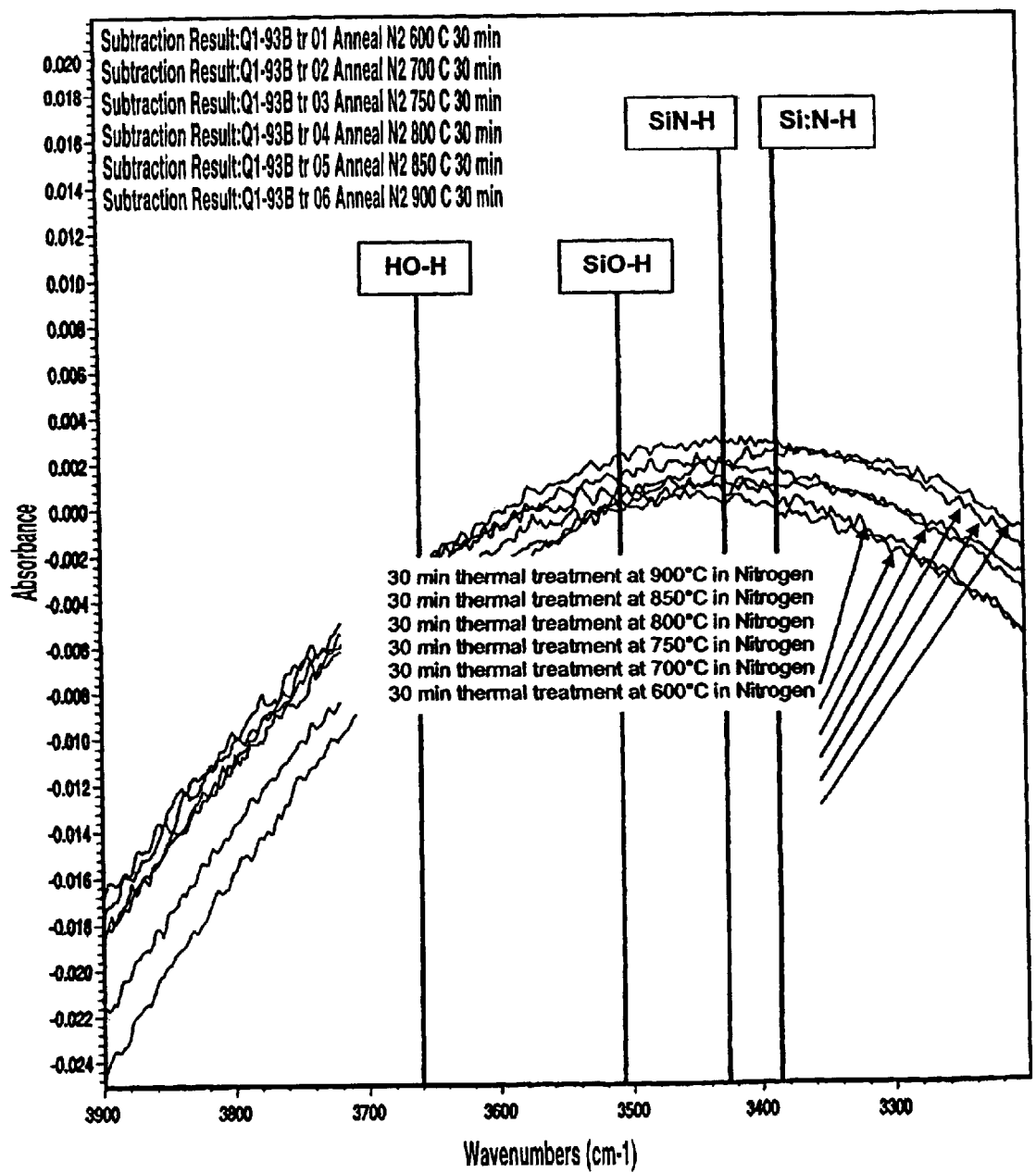
Figure 5:
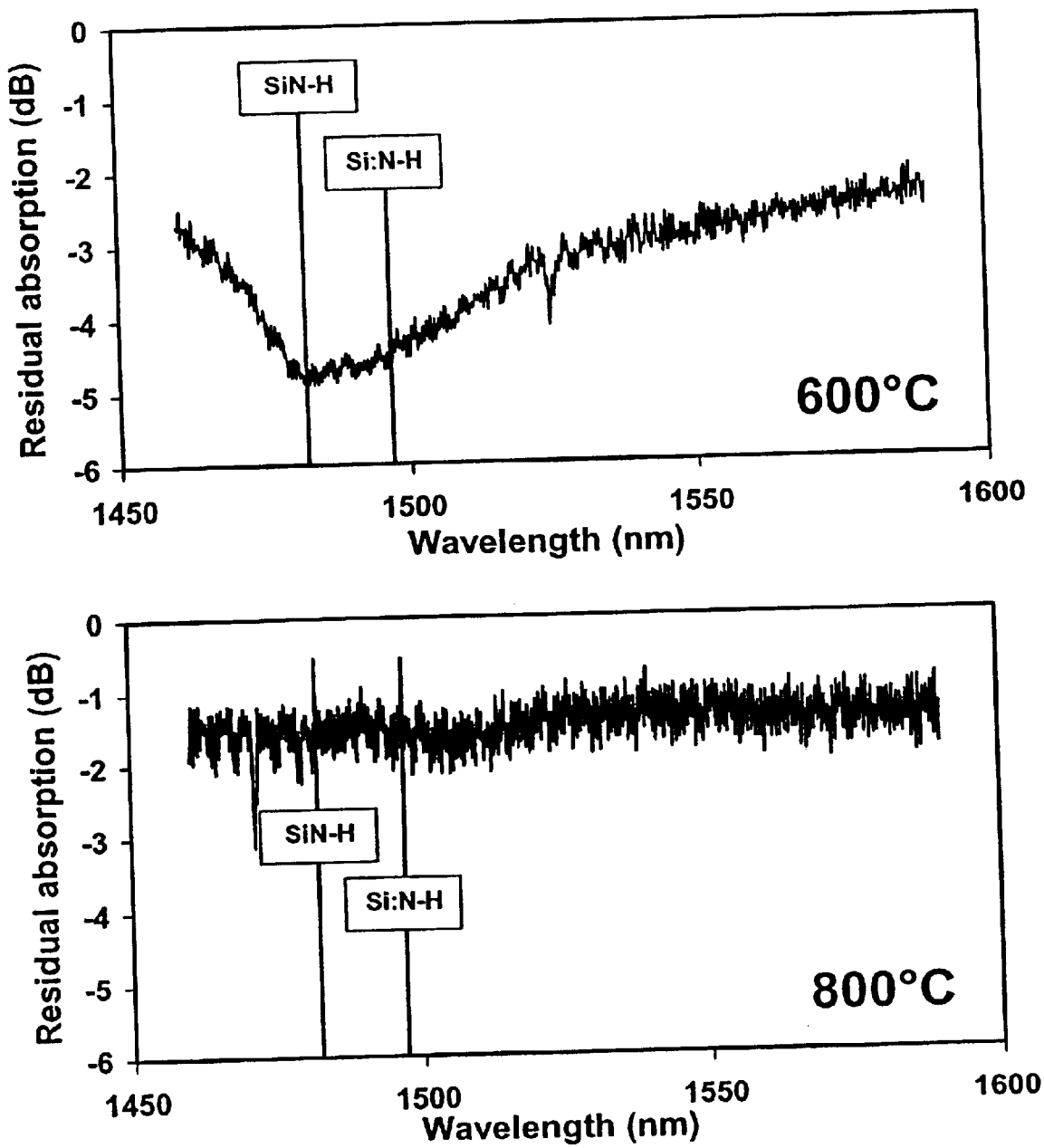
FIG. 5 shows that a thermal treatment of the cladding silica layer at a temperature of only 600° C. is not sufficient to completely eliminate the residual SiN—H and Si:N—H oscillators of the upper cladding silica layer. It is then necessary to increase the temperature of this final thermal treatment of the cladding silica layer beyond 600° C.
Figure 6:
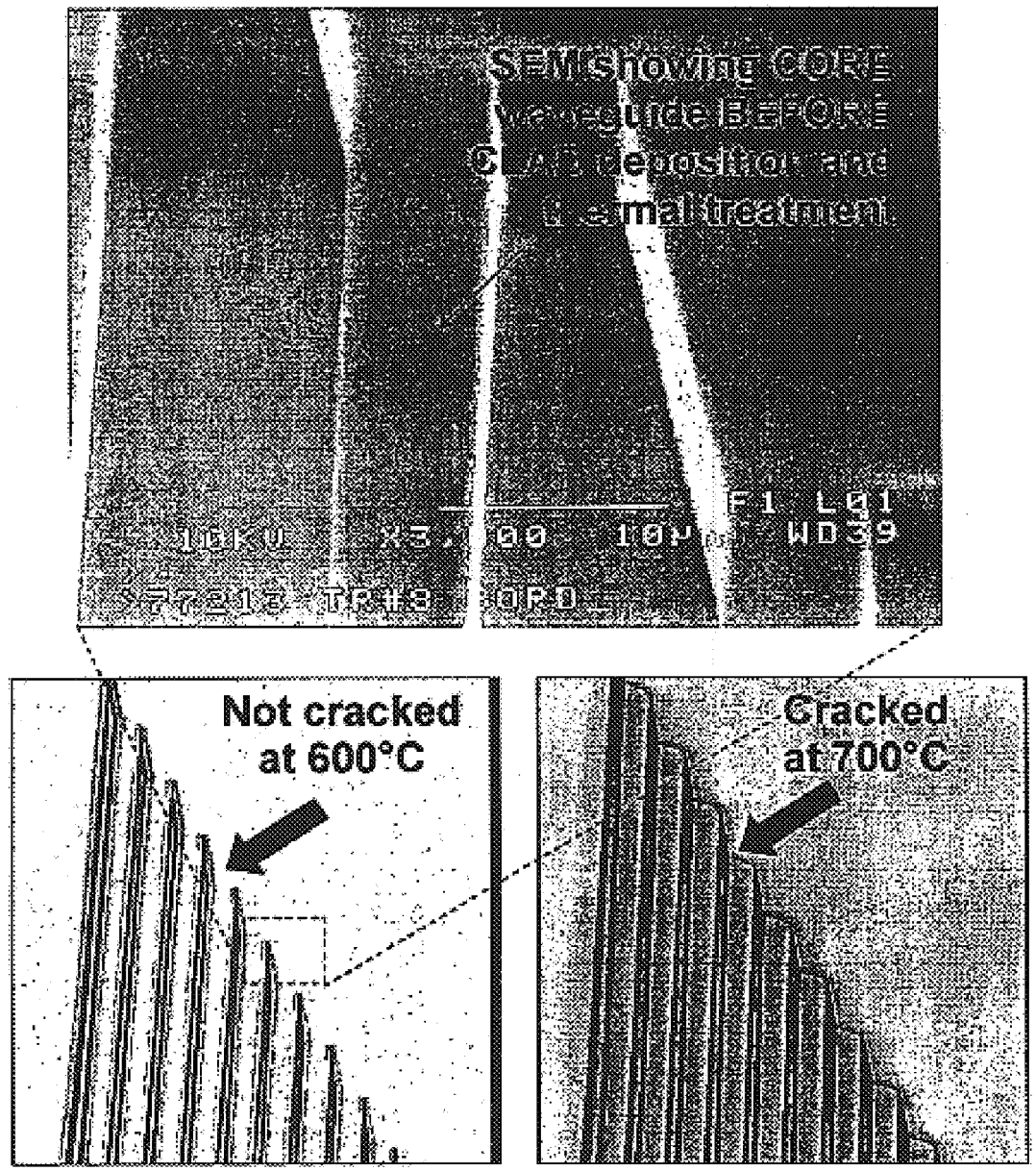
FIG. 6, FIG. 7 and FIG. 8 show such a final thermal treatment of the cladding silica layer at a temperature beyond 600° C. can result in cracking of the various silica layers joining deep etched structures in the optical device.
Figure 7:
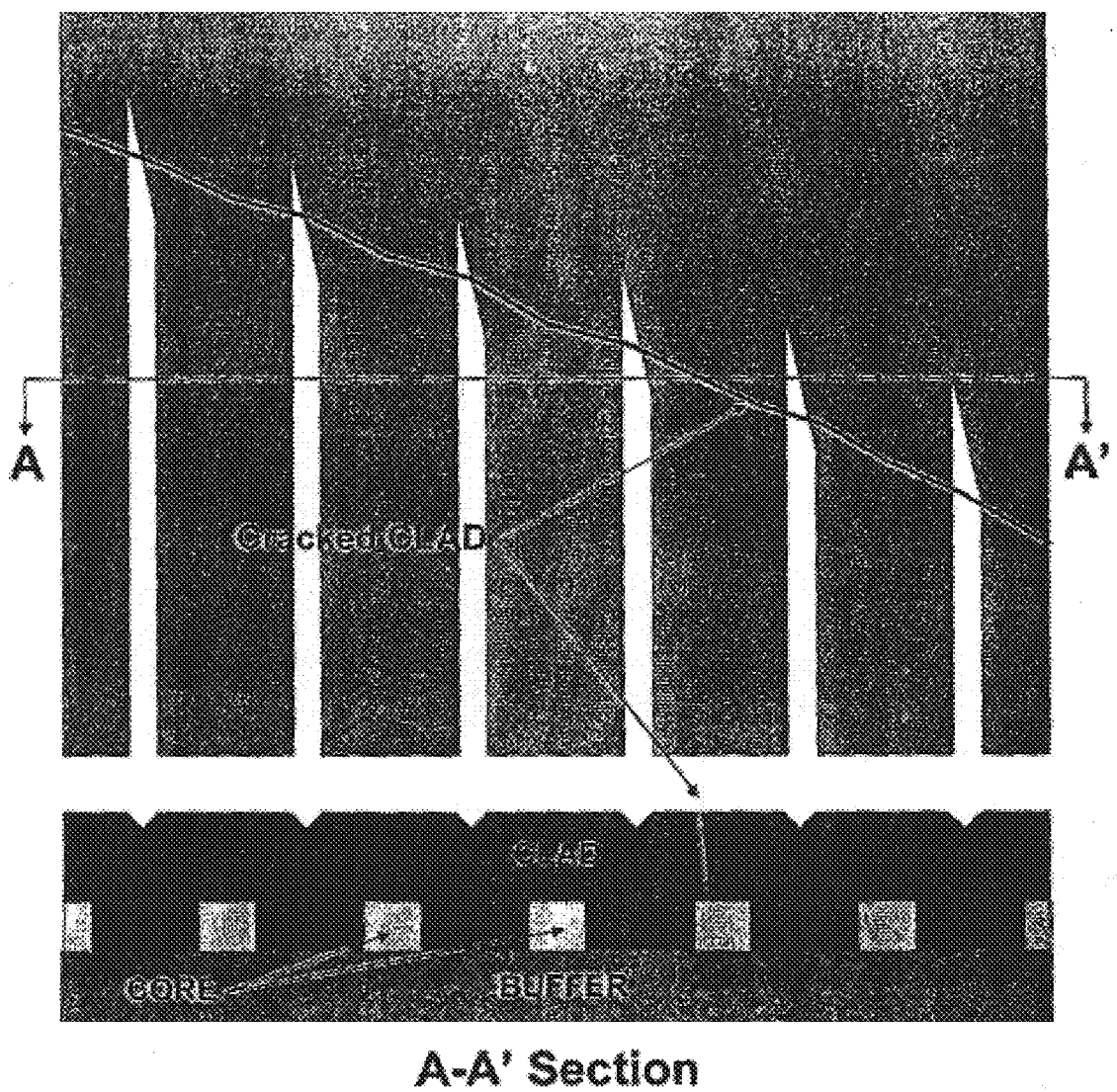
Figure 8:
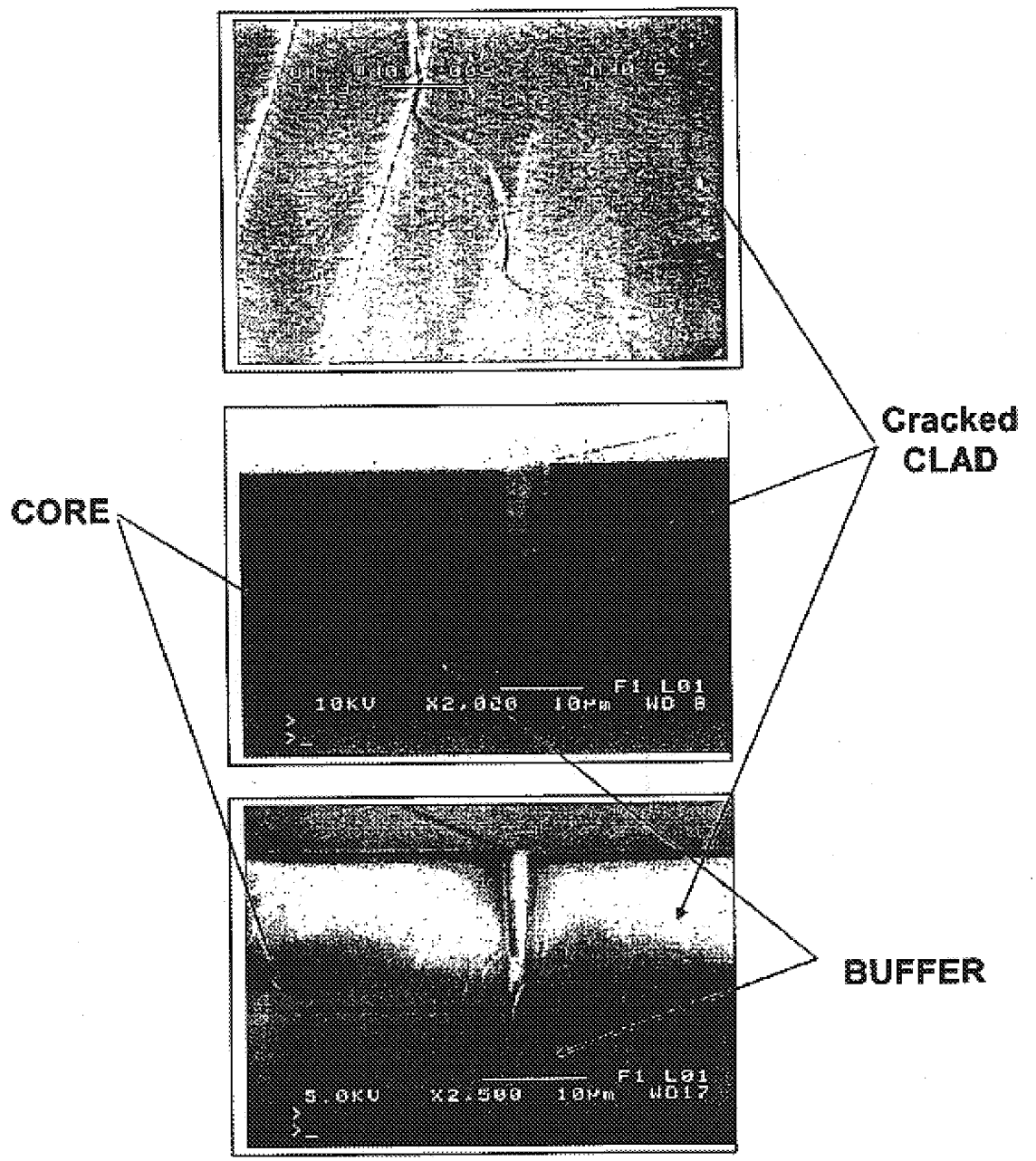
Figure 9:
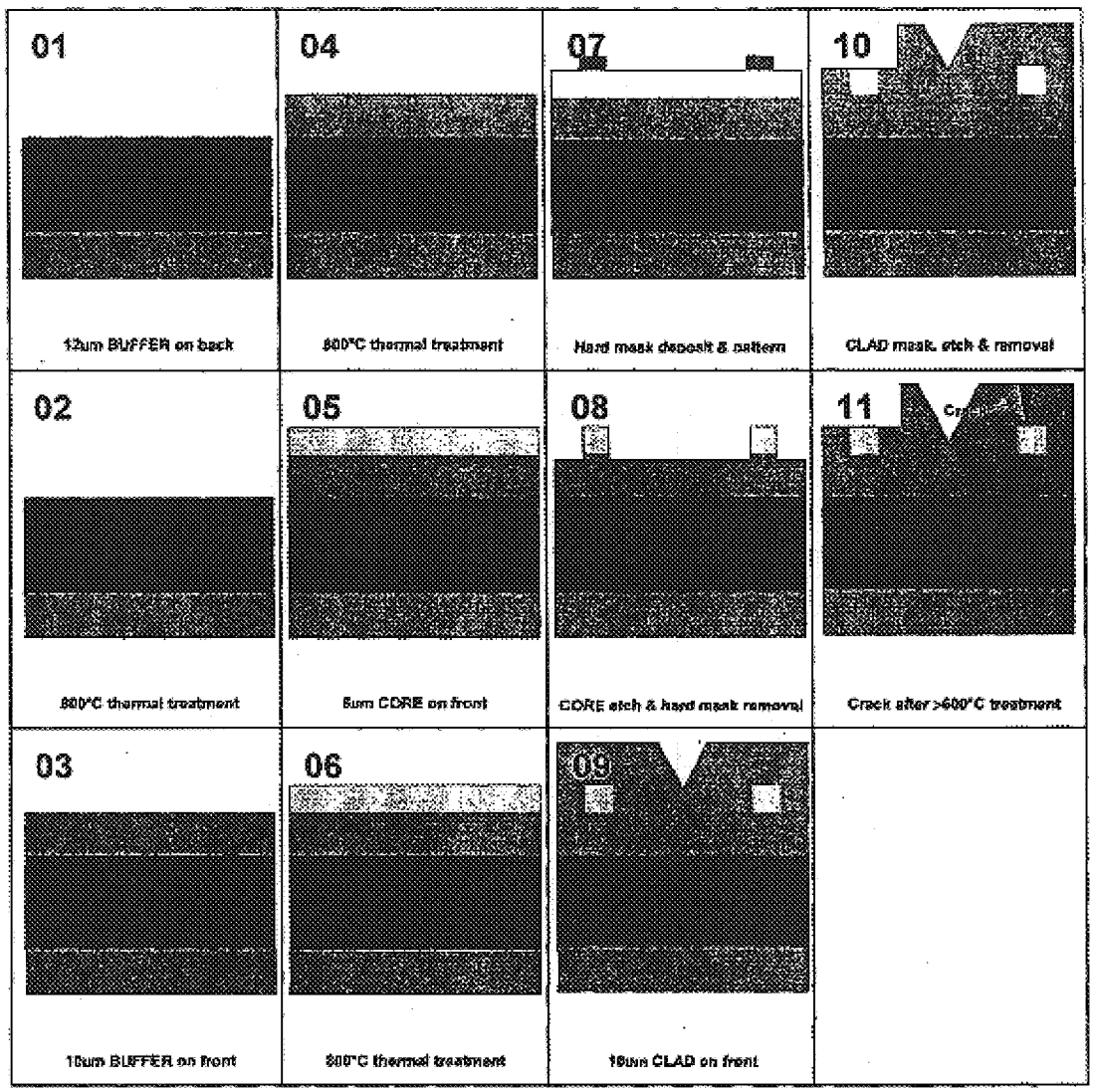
Figure 10:
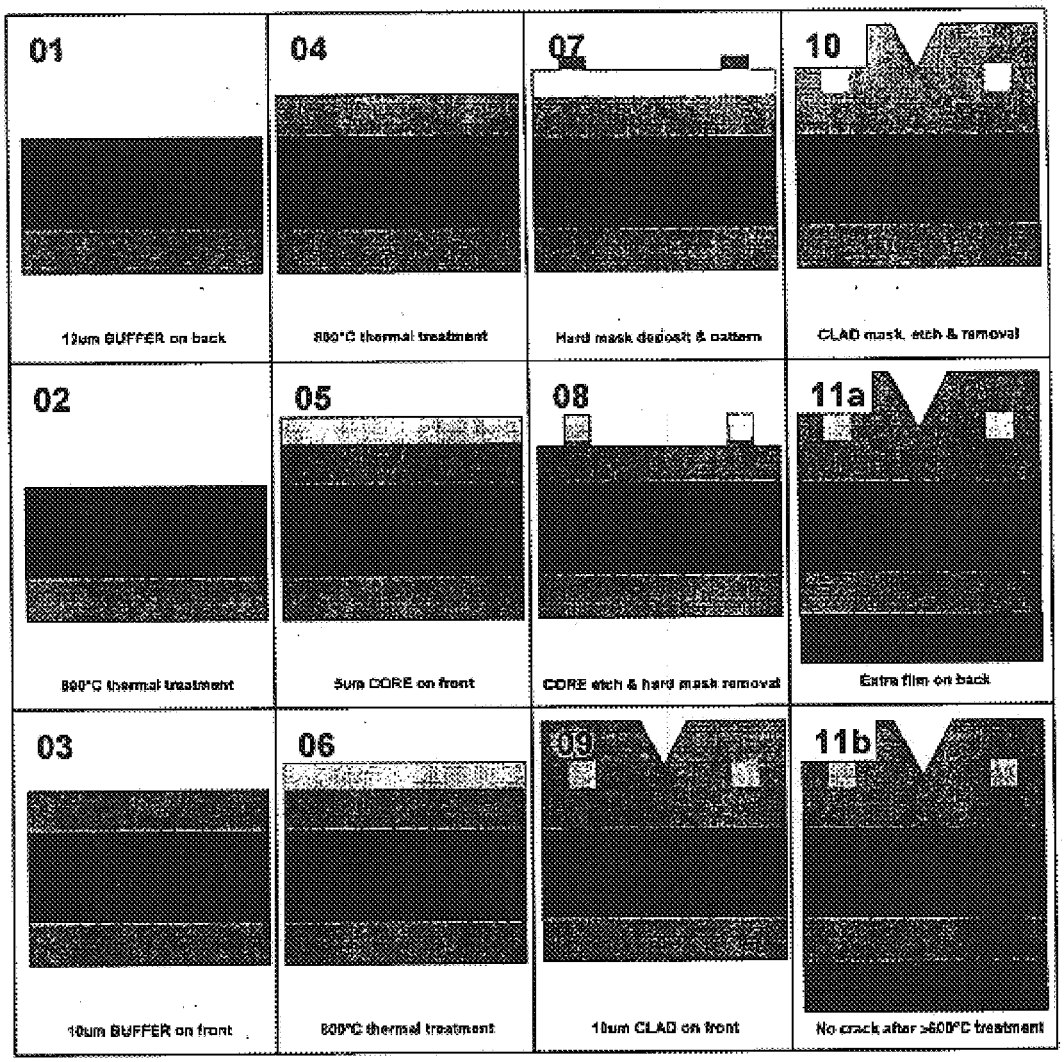
Figure 11:
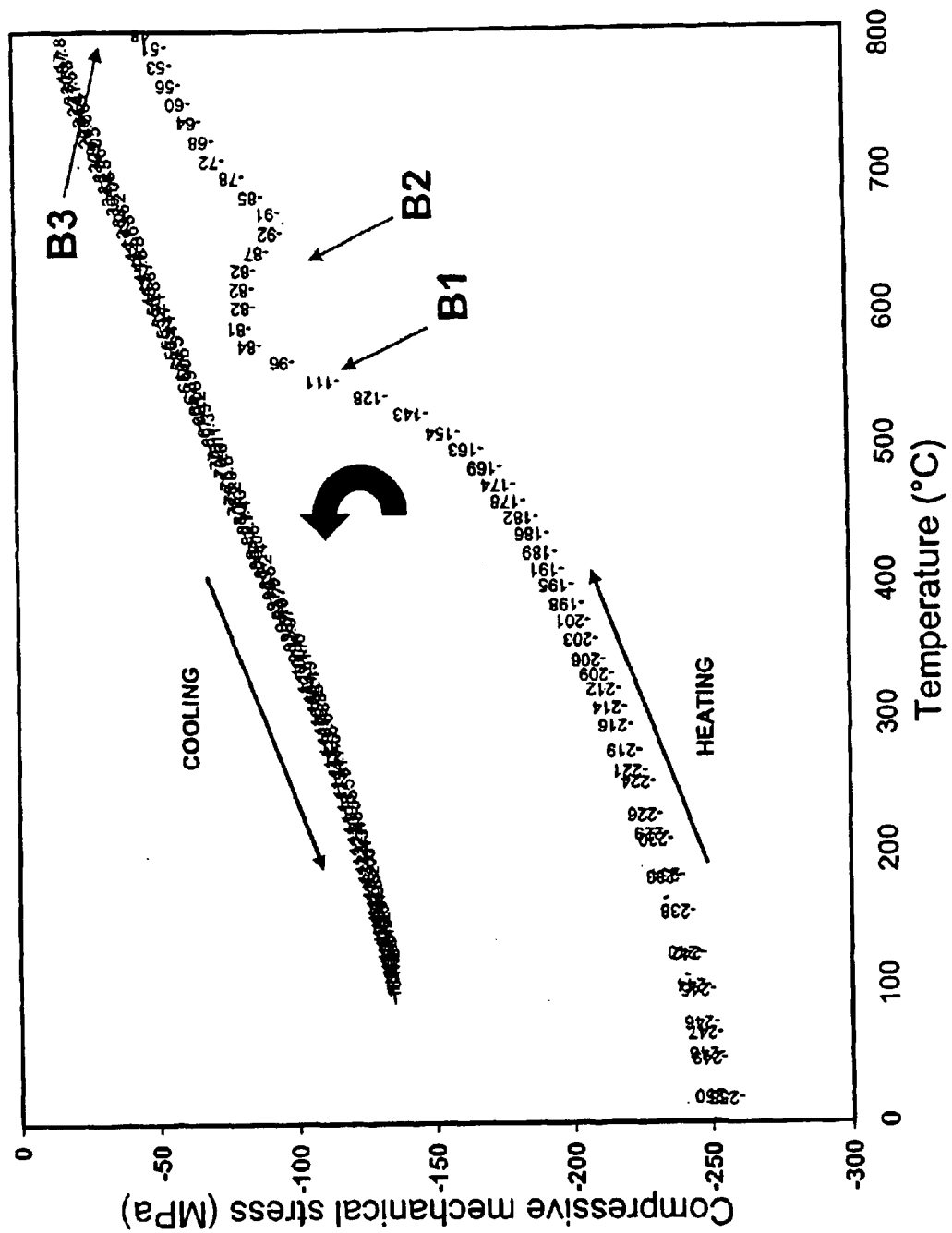
Figure 12:
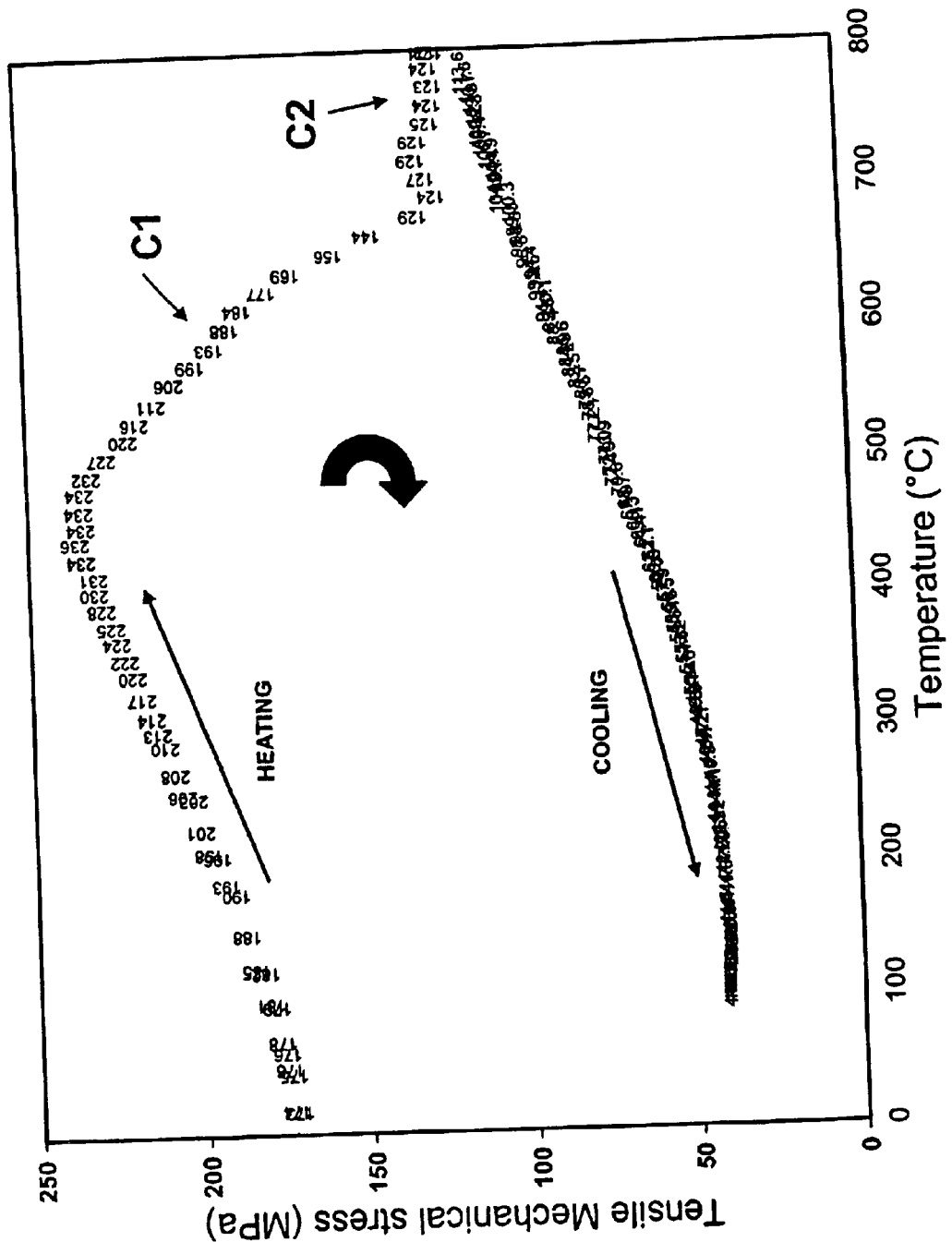
Figure 14:
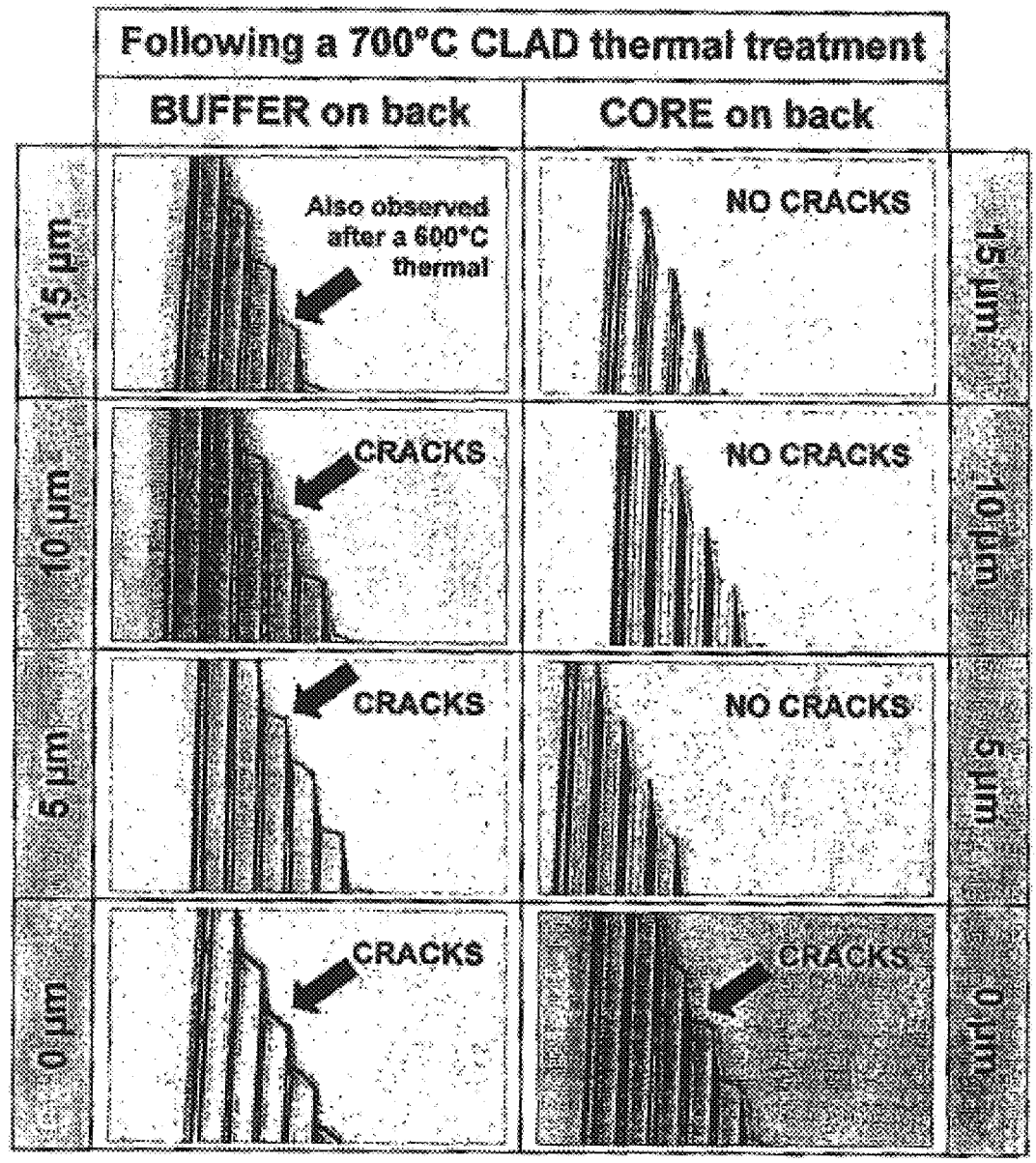
Figure 15:
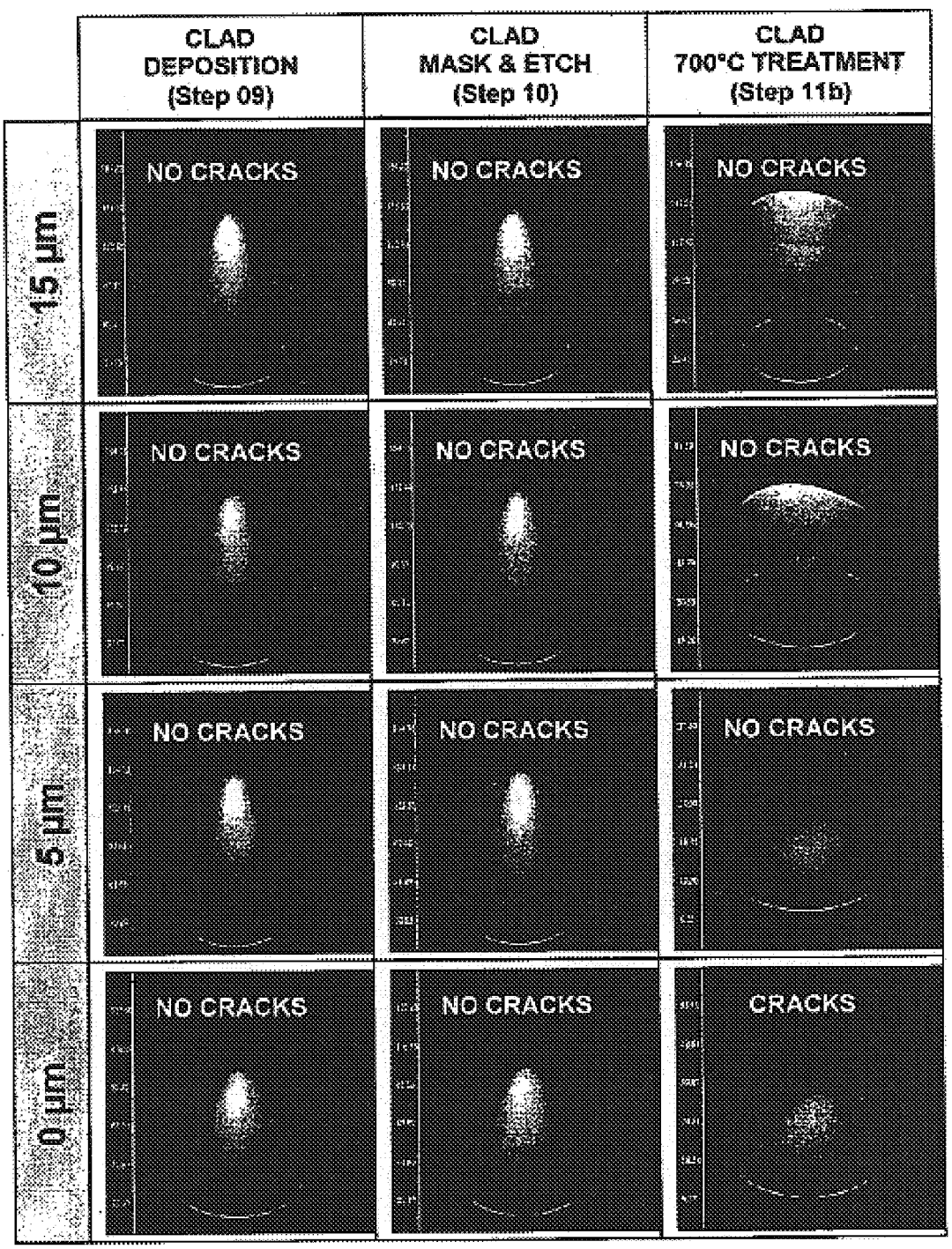

The invention will now be described in more detail, by way of example only, with reference to the accompanying drawings, in which:

FIG. 1 shows the 3200–3900 cm-1 FTIR spectra of a buffer deposited with a typical PECVD process after a 600° C. to 1100° C. thermal treatment;

FIG. 2 shows the 3200–3900 cm-1 FTIR spectra of buffer obtained with the technique described in our first co-pending patent after a 800° C. thermal treatment;

FIG. 3 shows the 3200–3900 cm-1 FTIR spectra from of core obtained with the technique described in second co-pending patent application after an 800° C. thermal treatment FIG. 4 shows the 3200–3900 cm-1 FTIR spectra from of core obtained with the technique described in our third co-pending application after a thermal treatment at various temperatures;

FIG. 5 shows the effect of the temperature of the final thermal treatment on the residual infrared optical absorption;

FIG. 6 consists of crack photographs of the optical devices following a cladding thermal treatment at a temperature exceeding 600° C.;

FIG. 7 shows the crack location of the optical devices following a final thermal treatment at a temperature exceeding 600° C.;

FIG. 8 shows the crack location of the optical devices following a final thermal treatment at a temperature exceeding 600° C.;

FIG. 9 shows the main fabrication steps showing the appearance of the crack following the final thermal treatment at a temperature exceeding 600° C.;

FIG. 10 shows the additional step 11a in the main fabrication steps to prevent cladding cracking during the final thermal treatment at a temperature exceeding 600° C.;

FIG. 11 shows the stress hysteresis of a buffer layer from room temperature to 800° C.;

FIG. 12 shows the stress hysteresis of a core layer from room temperature to 800° C.;

FIG. 13 shows the crack elimination effect of depositing 5, 10 and 15 μm thick buffer and 5, 10 and 15 μm thick core on the back of the wafer prior to performing 600° C. and 700° C. cladding thermal treatments;

FIG. 14 shows the effect of depositing an extra 5, 10 or 15 μm thick buffer or an extra 5, 10 or 15 μm thick core on the back on cladding cracking following a 700° C. thermal treatment; and FIG. 15 shows the effect of an extra 5, 10 or 15 μm core on the back on wafer warp during processing and following a 700° C. cladding thermal treatment.

DETAILED DESCRIPTION OF THE PREFERRED EMBODIMENTS

In carrying out the exemplary embodiment of the invention, a series of basic steps are carried out on a silicon wafer as follows:

Step 01: A 12 μm buffer deposition is performed on the back of the wafer so as to prevent following photolithography problems resulting from excessive wafer warp following high temperature heat treatments of a 10 μm thick buffer and a 5 μm thick core to be deposited on the front of the wafer as described in our co-pending U.S. patent application Ser. No. 09/799,491 entitled "Method of making a functional device with deposited layers subject to high temperature anneal", the contents of which are herein incorporated by reference.

Step 02: A thermal treatment is performed at 800° C. to cause densification of the buffer layer on the back side of the wafer and to stabilize its mechanical properties from room temperature to 800° C. This effect is shown on FIG. 11, which shows the compressive mechanical stress of the buffer layer as its temperature is increased from room temperature to 800° C. and then decreased from 800° C. to room temperature. As described in our U.S. co-pending patent application Ser. No. 09/956,916, this stress hysteresis curve shows that the mechanical stress of buffer:
  a) is compressive at about −250 MPa prior to the stress hysteresis cycle;
  b) is compressive throughout the complete stress hysteresis cycle;
  c) decreases almost linearly as the temperature is linearly increases (This is an expected situation since the (almost constant) coefficient of linear expansion of silica-based buffer (cladding) is smaller than that of the underlying silicon);
is compressive at about −150 MPa after the stress hysteresis cycle; and shows three plastic deformation regions during the stress hysteresis cycle, namely
  (i) Region B1, from 450° C. to 575° C., where it decreases much faster than would be expected from a linear decrease associated with its elastic deformation;
  (ii) Region B2, from 575° C. to 650° C., where it is almost constant; and
  (iii) Region B3, during the 180 minutes stabilization at 800° C., where it decreases as the temperature remains unchanged.

Further heat treatments of this heat treated buffer layer up to a temperature not exceeding this treatment temperature of 800° C. show no stress hysteresis. That is the compressive mechanical stress decreases linearly with an increase of temperature up to 800° C. and then increases again linearly with no hysteresis with a decrease of temperature to room temperature.

Step 03: A 10 μm buffer deposition is performed on the front of the wafer.

Step 04: A thermal treatment at 800° C. is performed. Again, this treatment will cause its densification and will stabilize its mechanical properties from room temperature to 800° C., thus resulting in no stress hysteresis during further heat treatments of this heat treated buffer up to a temperature not exceeding this treatment temperature of 800° C.

Step 05: A 5 µm core deposition is performed on the front of the wafer.

Step 06: thermal treatment at 800° C. is carried out to cause the densification of the core layer and to stabilize its mechanical properties from room temperature to 800° C. This effect is illustrated in FIG. 12, which shows the tensile mechanical stress of core as its temperature is increased from room temperature to 800° C. and then decreased from 800° C. to room temperature. As described in our copending U.S. patent application Ser. No. 09/956,916, this stress hysteresis curve shows that the mechanical stress of core:
  a) is tensile at about 175 MPa prior to the stress hysteresis cycle;
  b) is tensile throughout the complete stress hysteresis cycle;
  c) is tensile at about 40 MPa after the stress hysteresis cycle;
  d) increases almost linearly as the temperature linearly increases (This is an expected situation since the almost constant coefficient of linear expansion of silica-based core is smaller than that of the underlying silicon); and
  shows two plastic deformation regions during the stress hysteresis cycle, namely:
    (i) Region C1, from 450° C. to 675° C., where it reverses its trends and in fact decreases as the temperature is increasing; and
    (ii) Region C2, from 675° C. to 800° C., where it is almost constant;

Further heat treatments of this heat treated core up to a temperature not exceeding this treatment temperature of 800° C. show no stress hysteresis. That is the tensile mechanical stress decreases linearly with an increase of temperature up to 800° C. and increases again linearly with no hysteresis with a decrease of temperature up to room temperature.

Step 07: Hard mask is deposited and patterned.

Step 08: A core etch is performed using the hard mask followed by removal of the hard mask.

Step 09: A 10 µm cladding deposition is carried out on the front of the wafer.

Step 10: A cladding masking is followed by etching and mask removal.

Step 11: A thermal treatment at a temperature greater than 600° C. is carried out, typically 700° C.

The described fabrication sequence up to Step 10 can provide substantially crack-free devices such as the one observed on the left-side optical photograph of FIG. 6.

As shown in FIG. 5, the thermal treatment of the cladding (Step 11) is required to eliminate residual SiN—H and Si:N—H oscillators and the temperature of this thermal treatment (Step 11) should be higher than 600° C. Unfortunately, FIG. 6, FIG. 7 and FIG. 8 show that such high temperature heat treatments are associated with cracks propagating from the tip of a given waveguide to the tip of neighboring waveguides.

The three SEM pictures of FIG. 8 indicate that the crack only propagates in cladding and stops at the cladding-core interface, suggesting that the mechanical stress of cladding is tensile and the mechanical stress of core is compressive.

In order to prevent crack propagation in the cladding, it is necessary to reduce its tensile mechanical stress, particularly at high temperature.

Comparing FIG. 10 with FIG. 9 shows that adding an extra film on the back of the wafer just prior to step 11, i.e. after deposition of the cladding layer, can reduce the tensile mechanical stress, and indeed induce compressive mechanical stress in the cladding and thereby prevent cladding cracking following a temperature treatment of the cladding at a temperature of more than 600° C.

FIG. 11 and FIG. 12 show that the buffer and core layers have opposite mechanical stress behaviors. The mechanical stress of buffer is compressive and becomes less compressive during high temperature treatments while the mechanical stress of core is tensile and becomes less tensile during high temperature treatments. Depositing either an extra buffer or an extra core on the back of the wafer should then have an opposite effect on the crack prevention of cladding on the front face: a compressive stress buffer should cause even worse cracking (since its deposition of the back will induce an even more tensile stress on films already deposited on the face) and tensile stress core should reduce cracking (since its deposition of the back will tend to induce a compressive stress on films already deposited on the face).

This effect is shown in FIG. 13 and FIG. 14, which demonstrate the effect on cladding cracking of depositing either 5, 10 or 15 µm thick buffer or 5, 10 or 15 µm thick core on the back of the wafer prior to performing 600° C. and 700° C. cladding thermal treatments. From the table of FIG. 13 and the pictures of FIG. 14, it will be seen that the deposition of a buffer layer on the back side increases cladding cracking: depositing an extra 15 µm thick buffer on the back causes cracks to be already observed after a thermal treatment of only 600° C., a temperature at which cracking is prevented without extra films deposited on the back. From FIG. 13, it can also be seen that the deposition of the core layer on the back side reduces cladding cracking. Cracks are not observed if an extra core is deposited prior to a thermal treatment of 700° C., a temperature at which cracking is always observed with no extra films deposited on the back side.

FIG. 15 helps understand the mechanism by monitoring the warp of wafers having either 0, 5, 10 or 15 µm thick core deposited on the back side of the wafer at step 11a of FIG. 10 following some of the process steps of FIG. 10 and following the 600° C. or 700° C. cladding thermal treatment.

A larger U-shape in FIG. 15 (Note that the Y-axis scales are not identical for all reported wafer shapes) is associated with a more compressive stress on films deposited on the front face. Conversely, a larger inverted-U-shape of FIG. 15 is associated with a more tensile stress on films deposited on the front face.

It is apparent from this FIG. 15 that the inverted-U-shape wafer is already very large after cladding deposition (Step 9; first column) showing that the cladding on the front face is very prone to cracking if temperature is increased; the inverted U-shape wafer warp is not changed after cladding etch (Step 10; second column) showing that the cladding on the front face is still very prone to cracking if temperature is increased; and following a 700° C. thermal treatment, the wafer warp is converted from an inverted-U-shape to a U-shape as the thickness of core deposited on the back face is increased from 0 to 15 µm (Step 11b; fifth column), showing that the cladding on the front face becomes gradually less prone to cracking during and following this 700° C. thermal treatment. It should be noted that the 5 µm thick core on the back shows a slight inverted-U-shape following this 700° C. thermal treatment, thus indicating that this thickness of core on the back is a little too thin to ensure a robust crack-free process following a 700° C. thermal treatment.

The observation of the back of the wafer indicates that wafers with 15 μm of extra core on the back are now associated with cracks on the back of the wafer; i.e. the cracking mechanism is then transported from the front face to the back face of the wafer. Even if these cracks on the back of the wafer do not affect the performance of the optical devices on the front of the wafer, it is important to prevent such cracking on the back side to prevent contamination of the wafer holding equipment. An optimum extra core thickness lies between 5 and 15 μm.

It will be appreciated by one skilled in the art that many variations in the implementation are possible. By way of non-limiting example, referring to FIG. 10 the steps could be modified as follows:

Step 01: The 12 μm buffer deposition on the back of the wafer could be thinner or thicker, in the range preferably between 5 to 25 μm.

Step 02: The 800° C. thermal treatment could be carried at a lower or higher temperature in the range preferably between 500 and 1200° C.

Step 03: The 10 μm buffer deposition on the front of the wafer could be thinner or thicker, in the range preferably between 5 to 25 μm;

Step 04: The 800° C. thermal treatment could be carried at lower or higher temperature in the range between 500 and 1200° C.

Step 05: The 5 μm core deposition on the front of the wafer could be thinner or thicker, in the range preferably between 2 to 10 μm;

Step 06: The 800° C. thermal treatment could be carried out at a lower or higher temperature in the range preferably between 500 and 1200° C.

Step 07: The hard mask deposit and pattern could be using photoresist instead of a hard mask.

Step 08: The core etch could use photoresist.

Step 09: The 10 μm cladding deposition on the front of the wafer could be thinner or thicker, in the range preferably between 0.5 to 25 μm.

Step 10: The cladding masking followed by etching and mask removal could be eliminated.

Step 11a: The extra layer deposited on the back of the wafer could have a tensile mechanical stress preferably ranging from 10 to 2000 MPa, and be deposited by a number of techniques including: Plasma Enhanced Chemical Vapor Deposition (PECVD); Low Pressure Chemical Vapor Deposition (LPCVD); Electron Cyclotron Resonance Deposition (ECRD); Bias Sputtering Deposition (BSD); Metal-Organic Chemical Vapor Deposition (MOCVD).

The extra layer could be a silicon oxide (alloyed or not with boron, phosphorus, arsenic or other elements), a silicon nitride (incorporating oxygen as to form oxynitride, or other elements), an amorphous silicon, a polysilicon, a refractory metal or compound such as titanium nitride or other high temperature compatible metal or compound capable of sustaining the required thermal treatment.

Step 11b: The 700° C. thermal treatment could be carried out at lower or higher temperature in the range preferably between 500 and 1200° C.

Many other variations are possible as will be apparent to one skilled in the art in the light of the above teaching.

The invention finds application in many types of device. Typical examples of photonics devices other than Mux/Dmux devices are: Add-After-Drop Filters (AADF) devices; Arrayed Wave Guide (AWG) and Arrayed Wave Guide Grating (AWGG) devices; A thermal Arrayed Wave Guide (AAWGG) devices; Distributed Feedback Laser Diode (DFB-LD) devices; Erbium Doped Fiber Amplifier (EDFA) devices; Four Wave Mixing (FWM) devices; Fresnel Mirror (FM) devices;

Laser Diode (LD) devices; Light Emitting Diodes (LED) devices; Mach-Zenhder (MZ), Mach-Zenhder Interferometer (MZI), Mach-Zenhder Interferometer Multiplexer (MZIM) devices; Monitor Photo Diode (MPD) devices; Multi-Wavelength Optical Sources (MWOS) devices; Optical Add/Drop Multiplexers (OADM) devices; Optical Amplifier (AF) devices; Optical Cross-Connect (OCC, OXC) devices; Optical Cross Point (OCP) devices; Optical Filter (OF) devices; Optical Interferometer (OI) devices; Optical Network Unit (ONU) devices; Optical Saw Wave (OSW) devices; Optical Splitter (OS) devices; Optical Switch (OSW) and Optical Switch Module (OSM) devices; Photonic ATM (PATM) switching devices; Planar Lightwave Circuits (PLC) devices; Positive Emitter Coupled Logic (PECL) devices; Quarter Wave (QW) devices; Receiver Photo Diode (RPD) devices; Semiconductor Optical Amplifier (SOA) devices; Spot-Size converter integrated Laser Diode (SS-LD) devices; Sub-Carrier Multiplexing Optical Network Unit (SCM-ONU) devices; Temperature Insensitive Arrayed Wave Guide (TI-AWG) devices; Thermo-Optic (TO) devices and Thermo-Optic Switch (TOS) devices; Time Compression Multiplexing-Time Division Multiple Access (TCM-TDMA) devices; Time Division Multiplexing (TDM) devices; Tunable Receiver (TR) devices; Uniform-Loss Cyclic-Frequency Arrayed Wave Guide (ULCF-AWG) devices; Vertical Cavity Surface Emitting Laser (VCSEL) devices; and Wavelength Dispersive Multiplexing (WDM), Wavelength Dispersive Multiplexing Transceivers (WDMT) devices. Other possible Micro-Electro-Mechanical Systems (MEMS) devices are. Information Technologies MEMS devices;

Medical/Biochemical MEMS devices: Biochips devices; Lab-On-A-Chip (LOAC) devices; Micro-Total Analysis System (μ-TAS) devices; Automotive MEMS devices; Industrial/Automation MEMS devices; and Environmental Monitoring MEMS devices.

This list is not intended to be exhaustive and a person skilled in the art will readily appreciate that the invention may find application in other technologies.

We claim:

1. In a method of making an integrated photonic device having buffer, core and cladding layers deposited on a front side of a wafer and a buffer layer deposited on a back side of said wafer, the improvement wherein after deposition of said buffer layer on the back side of said wafer, an extra thick layer in tensile stress is deposited on said back side of the wafer just prior to performing a high temperature thermal treatment above 500° C. on the cladding layer to prevent the cracking of said cladding layers as a result of said high temperature thermal treatment.

2. The method as claimed in claim 1, wherein said extra layer has a thickness in the range 5 to 15 μm.

3. The method as claimed in claim 2, wherein said extra layer is deposited next after deposition of said cladding layer.

4. The method as claimed in claim 3, wherein said extra layer is made of the same material as said core layer.

5. The method as claimed in claim 4, wherein said extra layer is deposited by a technique selected from the group consisting of: Plasma Enhanced Chemical Vapor Deposition (PECVD); Low Pressure Chemical Vapor Deposition (LPCVD); Electron Cyclotron Resonance Deposition (ECRD); Bias Sputtering Deposition (BSD); and Metal-Organic Chemical Vapor Deposition (MOCYD).

6. The method as claimed in claim 2, wherein said extra layer has a tensile mechanical stress ranging from 10 to 2000 MPa.

7. The method as claimed in claim 6, wherein said buffer, core and cladding layers are silica, said buffer and cladding lavers have a low refractive index and said core layer has a high refractive index.

8. The method as claimed in clam 1, wherein said extra layer is silica.

9. The method as claimed in claim 1, wherein said extra layer is silicon oxide.

10. The method as claimed in claim 9, wherein said silicon oxide is alloyed with an element selected from the group consisting of: boron, phosphorus, and arsenic.

11. The method as claimed in claim 9, wherein said extra layer is selected from the group consisting of: silicon nitride, silicon nitride, amorphous silicon, a polysilicon, a refractory metal, and titanium nitride.

12. The method as claimed in claim 1, wherein said thermal treatment is carried out at a temperature in the range between 500 and 1200° C.

13. The method as claimed in claim 1, wherein said thermal treatment is carried out at a temperature of about 700° C.

14. A The method as claimed in claim 1, wherein a first thermal treatment is carried out after deposition of said buffer layer at a temperature between 500 and 1200° C.

15. The method as claimed in claim 14, wherein said first thermal treatment is carried out a temperature of about 800° C.

16. The method as claimed in claim 15, wherein said cladding layer is deposited after said second thermal treatment, and said extra layer is deposited next after deposition of said cladding layer.

17. The method as claimed in claim 14, wherein a second thermal treatment is carried out after deposition of said core layer at a temperature between 500 and 1200° C.

18. The method as claimed in claim 14, wherein second first thermal treatment is carried out a temperature of about 800° C.

19. A method of making a photonic device, comprising:
providing a wafer having a front side and a back side;
depositing a buffer layer on the back side of said wafer;
depositing a buffer layer on the front side of said wafer;
subjecting the wafer to a first thermal treatment between 500 and 2000° C;
depositing a core layer over said buffer layer;
subjecting the wafer to a second thermal treatment between 500 and 1200° C;
depositing a cladding layer;
depositing extra layer in tensile stress on the back side of the wafer to prevent the cracking of the cladding layer during subsequent high temperature thermal treatment; and performing said high temperature thermal treatment above about 600° C. on the cladding layer.

20. The method as claimed in claim 19, wherein said extra layer has a thickness in the range 5 to 15 $\mu$m.

21. The method of claim 20, wherein said extra layer has a tensile mechanical stress ranging from 10 to 2000 MPa.

22. The method as claimed in claim 21, wherein said extra layer is silica.

23. The method as claimed in claim 22, wherein said buffer, core and cladding layers are silica.

24. The method as claimed in claim 19, wherein said extra layer is deposited by PECVD.

* * * * *